(12) United States Patent
Nakaguchi et al.

(10) Patent No.: US 12,289,046 B2
(45) Date of Patent: Apr. 29, 2025

(54) POWER FEEDING CONTROL DEVICE

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventors: Shinnosuke Nakaguchi, Yokkaichi (JP); Kota Oda, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 239 days.

(21) Appl. No.: 17/906,295

(22) PCT Filed: Mar. 3, 2021

(86) PCT No.: PCT/JP2021/008233
§ 371 (c)(1),
(2) Date: Sep. 14, 2022

(87) PCT Pub. No.: WO2021/187116
PCT Pub. Date: Sep. 23, 2021

(65) Prior Publication Data
US 2023/0096983 A1    Mar. 30, 2023

(30) Foreign Application Priority Data

Mar. 16, 2020 (JP) ................................ 2020-045529

(51) Int. Cl.
*H03K 17/687* (2006.01)
*H02M 1/088* (2006.01)
*H02M 3/156* (2006.01)

(52) U.S. Cl.
CPC ........... *H02M 1/088* (2013.01); *H02M 3/156* (2013.01); *H03K 17/6871* (2013.01)

(58) Field of Classification Search
CPC .......................... H02H 11/002; H02H 11/003
See application file for complete search history.

(56) References Cited

U.S. PATENT DOCUMENTS

| 7,830,120 B2 * | 11/2010 | Ibrahim | H02J 7/00302 |
| | | | 324/426 |
| 2015/0109706 A1 | 4/2015 | Iwamizu | |
| 2019/0260197 A1 | 8/2019 | Nakaguchi et al. | |

FOREIGN PATENT DOCUMENTS

JP    2007-82374 A    3/2007

OTHER PUBLICATIONS

International Search Report, Application No. PCT/JP2021/008233, mailed Apr. 27, 2021. ISA/Japan Patent Office.

* cited by examiner

*Primary Examiner* — Peter M Novak
(74) *Attorney, Agent, or Firm* — Honigman LLP

(57) ABSTRACT

In a power feeding control device, N-channel first FET and second FET are located in a current path for current flowing from a positive terminal to a negative terminal. The drain of the first FET is located downstream of the source. The drain of the second FET is located upstream of the source. The cathode of a first diode is connected to the negative terminal. A first drive circuit and a second drive circuit switch ON or OFF the first FET and the second FET by adjusting the gates of the first FET and the second FET, with respect to the cathode of the first diode.

7 Claims, 10 Drawing Sheets

POWER FEEDING CONTROL DEVICE

CROSS-REFERENCE TO RELATED APPLICATIONS

This application is the U.S. national stage of PCT/JP2021/008233 filed on Mar. 3, 2021, which claims priority of Japanese Patent Application No. JP 2020-045529 filed on Mar. 16, 2020, the contents of which are incorporated herein.

TECHNICAL FIELD

The present disclosure relates to power feeding control devices.

BACKGROUND

JP 2007-82374A discloses a power feeding control device for vehicles that controls the power supply to a load from a DC power supply that is detachably connected between first and second terminals. When the positive and negative poles of the DC power supply are connected to the first and second terminals, respectively, the DC power supply is in normal connection. When the positive and negative poles of the DC power supply are connected to the second and first terminals, respectively, the connection of the DC power supply is in a reverse connection. A user may make an incorrect DC power supply connection, i.e., a reverse connection.

In the power feeding control device described in JP 2007-82374A, two N-channel FETs (Metal Oxide Semiconductor Field Effect Transistors) are arranged in a current path for current flowing from the first terminal to the second terminal. The drain of one of the FETs is located downstream of the source in the current path. The drain of the other FET is located upstream of the source in the current path. The value of the resistance between the drain and the source is adjusted by adjusting the gate voltage at the two FETs. The two FETs are switched ON by adjusting the value of resistance at the two FETs to sufficiently large value. The two FETs are switched OFF by adjusting the value of resistance of the two FETs to sufficiently small values.

In each of the two FETs, a parasitic diode is formed in which the cathode and the anode are connected to the drain and the source, respectively. In the power feeding control device described in JP 2007-82374A, the cathodes of the two parasitic diodes are connected to each other. Therefore, when the DC power supply is in reverse connection, as long as the two FETs are switched OFF, current cannot flow from the second terminal to the first terminal.

In the power feeding control device described in JP 2007-82374A, when the DC power supply is in reverse connection, power is not supplied to a switching circuit that switches the two FETs ON or OFF, and the switching circuit does not operate. However, the switching circuit adjusts the voltage of the two gates with respect to the potential of the second terminal. For this reason, the switching circuit is connected to the second terminal. If the DC power supply is in reverse connection, it is possible that the voltage of the DC power supply is applied to the gates of the two FETs via the switching circuit.

If the voltage of the DC power supply is applied to the gates of the two FETs, the value of resistance between the drain and the source of the two FETs will be reduced, so that current may flow from the second terminal to the first terminal via the load. In this case, the load may operate improperly.

Therefore, one object is to provide a power feeding control device that does not apply the voltage of a DC power supply to the gates of two FETs via a switching circuit when the positive and negative poles of the DC power supply are connected to second and first terminals.

SUMMARY

A power feeding control device of one aspect of the present disclosure is a power feeding control device for controlling power supply to a load from a DC power supply detachably connected between a first terminal and a second terminal, comprising a first N-channel FET whose drain is located downstream of its source in a current path for current flowing from the first terminal and the second terminal, a second N-channel FET whose drain is located upstream of its source in the current path, a diode whose cathode is connected to the second terminal, and a switching circuit for switching ON or OFF the first FET and the second FET by adjusting a voltage of gates of the first FET and the second FET, with respect to a potential of an anode of the diode, wherein a parasitic diode is formed in each of the first FET and the second FET, its cathode and anode being connected to the drain and the source, respectively.

Advantageous Effects of Disclosure

According to the present disclosure, the voltage of a DC power supply is not applied to the gates of a first EFT and a second FET via a switching circuit when the positive and negative poles of the DC power supply are connected to second and first terminals.

DETAILED DESCRIPTION OF PREFERRED EMBODIMENTS

Figure 1:
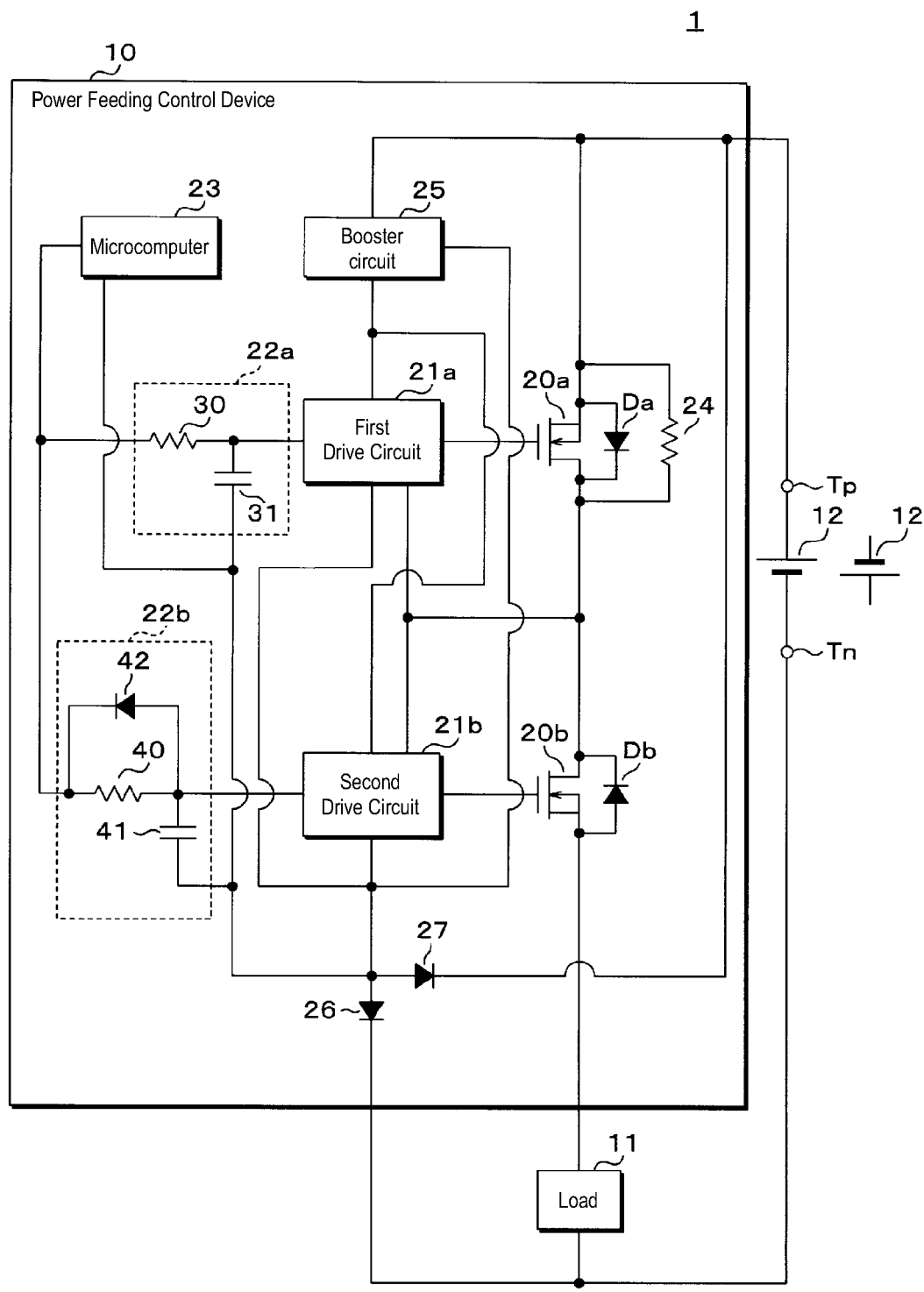
FIG. 1 is a block diagram illustrating the configuration of a main section of a power supply system according to an Embodiment 1.

First, aspects of the present disclosure will be listed and described. At least portions of the aspects described below may be combined as desired.

First Aspect

A power feeding control device of a first aspect of the present disclosure is a power feeding control device for controlling power supply to a load from a DC power supply detachably connected between a first terminal and a second terminal, comprising a first N-channel FET whose drain is located downstream of its source in a current path for current flowing from the first terminal and the second terminal, a second N-channel FET whose drain is located upstream of its source in the current path, a diode whose cathode is connected to the second terminal, and a switching circuit for switching ON or OFF the first FET and the second FET by adjusting a voltage of gates of the first FET and the second FET, with respect to a potential of an anode of the diode, wherein a parasitic diode is formed in each of the first FET and the second FET, its cathode and anode being connected to the drain and the source, respectively.

In the first aspect, the cathode of the diode is connected to the second terminal. As the switching circuit adjusts the voltage, with respect to the potential of the anode of the diode, the switching circuit is connected to the anode of the diode. Therefore, the voltage of the DC power supply is not applied to the gates of the first FET and the second FET via the switching circuit when positive and negative poles of the DC power supply are connected to the second and first terminals, respectively.

Second Aspect

The power feeding control device of a second aspect of the present disclosure comprises a second diode whose cathode and anode are connected to the first terminal and the anode of the diode, respectively.

In the second aspect, the cathode and the anode of a second diode are connected to the first terminal and the anode of the diode, respectively. Therefore, even when the positive pole and the negative pole of the DC power supply are connected to the first terminal and the second terminal, respectively, the voltage between the negative pole of the DC power supply and the anode of the diode is stabilized.

Third Aspect

The power feeding control device of a third aspect of the present disclosure comprises a switch connected between the first terminal and the anode of the diode, wherein the switch is OFF when the positive pole and the negative pole of the DC power supply are connected to the first terminal and the second terminal, respectively, and wherein the switch is ON when the negative pole and the positive pole of the DC power supply are connected to the first terminal and the second terminal, respectively.

In the third aspect, the switch is ON when the positive pole and the negative pole of the DC power supply are connected to the first terminal and the second terminal, respectively. Therefore, even when the positive pole and the negative pole of the DC power supply are connected to the first terminal and the second terminal, respectively, the voltage of the anode of the diode, with respect to a potential of the negative pole of the DC power supply, is stabilized.

Fourth Aspect

In the power feeding control device of a fourth aspect of the present disclosure, the switch is a semiconductor switch that is ON when a voltage of its control terminal, with respect to the potential of the anode of the diode, is higher than or equal to a predetermined voltage, and wherein the control terminal of the switch is connected to the second terminal.

In the fourth aspect, when the positive pole and the negative pole of the DC power supply are connected to the first terminal and the second terminal, respectively, with the voltage of the DC power supply higher than a predetermined voltage, the voltage at the control terminal of the switch becomes higher than or equal to the predetermined voltage so as to switch ON the switch.

Fifth Aspect

The power feeding control device of a fifth aspect of the present disclosure comprises a booster circuit for boosting a voltage of the first terminal, and a resistor connected between the drain and the source of the first FET, wherein, in the current path, the first FET is located upstream of the second FET and the second FET is located upstream of the load, and wherein when instructed to switch ON the first FET and the second FET with a voltage at a connection node between the first FET and the second FET higher than or equal to a second predetermined voltage, the switching circuit applies a voltage boosted by the booster circuit to the gates of the first FET and the second FET.

In the fifth aspect, a resistor is connected between the drain and the source of whichever of the first FET and the second FET is on the side of the first terminal. When the first FET and the second FET are switched OFF, no current flows through the first FET and the second FET. When the first FET and the second FET are switched OFF, the voltage at the connection node matches the voltage at the first terminal. Assume that the voltage at the connection node, i.e., the voltage at the first terminal, is higher than or equal to a second predetermined voltage when an instruction is issued to switch ON the first FET and the second FET. At this point, as it is possible to switch ON the second FET 20b by applying the voltage boosted by the booster circuit 25, the switching circuit applies the boosted voltage to the gates of the first FET and the second FET

Sixth Aspect

In the power feeding control device of a sixth aspect of the present disclosure, when instructed to switch ON the first FET and the second FET, the switching circuit switches ON the first FET before the second FET.

In the sixth aspect, the switching circuit switches ON the first FET before the second FET. Therefore, no current flows through the parasitic diode in the process of switching ON the first FET and the second FET

Seventh Aspect

In the power feeding control device of a seventh aspect of the present disclosure, when instructed to switch OFF the first FET and the second FET, the switching circuit switches OFF the first FET after the second FET.

In the seventh aspect, the switching circuit switches OFF the first FET after the second FET. Therefore, no current flows through the parasitic diode in the process of switching OFF the first FET and the second FET Specific examples of power supply systems of the present disclosure will be described hereinafter with reference to the drawings. The present disclosure is not limited by these examples but indicated by the claims, and all changes that come within the claims and the meaning and range of equivalency of the claims are intended to be encompassed within the scope of the disclosure.

Embodiment 1

System Configuration

FIG. 1 is a block diagram illustrating the configuration of a main section of a power supply system 1 of an Embodiment 1. The power supply system 1 is preferably installed onboard a vehicle and includes a power feeding control device 10, a load 11, and a DC power supply 12. The power feeding control device 10 has a first N-channel FET 20a and a second N-channel FET 20b. Each of the first FET 20a and the second FET 20b is, for example, a MOSFET (Metal Oxide Semiconductor Field Effect Transistor). A first parasitic diode Da is formed in the first FET 20a with its cathode and anode connected to the drain and the source, respectively. Similarly, a second parasitic diode db is formed in the second FET 20b with its cathode and anode connected to the drain and the source, respectively. The DC power supply 12 is, for example, a battery.

The source of the first FET 20a is connected to a positive terminal Tp. The drain of the first FET 20a is connected to the drain of the second FET 20b. The source of the second FET 20b is connected to one end of the load 11. The other end of the load 11 is connected to a negative terminal Tn.

The DC power supply 12, for example, a battery, is removably connected between the positive terminal Tp and the negative terminal Tn. The positive terminal Tp and the negative terminal Tn function as a first terminal and a second terminal, respectively. When the positive and negative poles of the DC power supply 12 are connected to the positive terminal Tp and the negative terminal Tn, respectively, the DC power supply 12 is in normal connection. If the positive and negative poles of the DC power supply 12 are connected to the negative terminal Tn and the positive terminal Tp, respectively, the DC power supply 12 is in reverse connection. A user of the power feeding control device 10 may connect the DC power supply 12 incorrectly, i.e., make a reverse connection.

The load 11 is an electrical apparatus installed onboard a vehicle. The first FET 20a and the second FET 20b function as a switch. When the state of each of the first FET 20a and the second FET 20b is ON, the value of the resistance between the drain and the source is sufficiently small to allow current to flow through the drain and the source. When the state of each of the first FET 20a and the second FET 20b is OFF, the value of resistance between the drain and the source is too great to allow current to flow through the drain and the source.

When the first FET 20a and the second FET 20b are switched ON with the DC power supply 12 in normal connection, current flows from the positive terminal Tp through the first FET 20a, through the second FET 20b, and to the load 11 in that order. As a result, power is supplied from the DC power supply 12 to the load 11 so as to operate the load 11. Under the same circumstances, when the first FET 20a and the second FET 20b are switched OFF, no current flows through the first FET 20a and the second FET 20b, and the power supply from the DC power supply 12 to the load 11 is stopped. At this point, the load 11 does not operate.

The drain of the first FET 20a is located downstream of its source in the current path for current flowing from the positive terminal Tp to the negative terminal Tn via the first FET 20a and the second FET 20b. In this current path, the drain of second FET 20b is located upstream of its source. In the foregoing current path, the first FET 20a is located upstream of the second FET 20b, and the second FET 20b is located upstream of the load 11.

When the DC power supply 12 is in normal connection, the power feeding control device 10 controls the power supply from the DC power supply 12 to the load 11 by switching the first FET 20a and the second FET 20b ON or OFF. When the DC power supply 12 is in reverse connection, the power feeding control device 10 maintains the first FET 20a and the second FET 20b in the OFF state. Therefore, when the DC power supply 12 is in reverse connection, the load 11 is not activated.

Configuration of Power Feeding Control Device 10

In addition to the first FET 20a and the second FET 20b, the power feeding control device 10 includes a first drive circuit 21a, a second drive circuit 21b, a first filter circuit 22a, a second filter circuit 22b, a microcomputer (hereinafter referred to as "the microcomputer") 23, a device resistor 24, a booster circuit 25, a first diode 26, and a second diode 27. The first filter circuit 22a includes a first resistor 30 and a first capacitor 31. The second filter circuit 22b includes a second resistor 40, a second capacitor 41, and a circuit diode 42. The booster circuit 25 has an input terminal to which voltage is input, an output terminal from which voltage is output, and a ground terminal.

The gate of the first FET 20a is connected to the first drive circuit 21a. In the first filter circuit 22a, one end of the first resistor 30 is connected to one end of the first capacitor 31. The first drive circuit 21a is also connected to a connection node between the first resistor 30 and the first capacitor 31. The other end of the first capacitor 31 is connected to the anodes of the first diode 26 and the second diode 27. The gate of the second FET 20b is connected to the second drive circuit 21b. In the second filter circuit 22b, one end of the second resistor 40 is connected to one end of the second capacitor 41 and the anode of the circuit diode 42. The second drive circuit 21b is additionally connected to a connection node between the second resistor 40 and the second capacitor 41. The other end of the second capacitor 41 is connected to the anodes of the first diode 26 and the second diode 27.

The other end of the second resistor 40 is connected to the other end of the first resistor 30 and the cathode of the circuit diode 42. The connection node between the first resistor 30 and the second resistor 40 is connected to the microcomputer 23. Additionally, the microcomputer 23 is connected to the anodes of the first diode 26 and the second diode. The device resistor 24 is connected between the drain and source of the first FET 20a. The positive terminal Tp is connected to the input terminal of the booster circuit 25. The output terminal of the booster circuit 25 is connected to the first drive circuit 21a and the second drive circuit 21b. The ground terminal of the booster circuit 25 is connected to the anodes of the first diode 26 and the second diode 27.

The connection node between the first FET 20a and the second FET 20b is connected to the first drive circuit 21a and the second drive circuit 21b. Each of the first drive circuit 21a and the second drive circuit 21b is further connected to the anodes of the first diode 26 and the second diode 27. The cathodes of the first diode 26 and the second diode 27 are connected to the negative terminal Tn and positive terminal Tp, respectively.

The value of resistance between the drain and the source of each of the first FET 20a and the second FET 20b varies depending on the voltage of the gate, with respect to the potential of the source. When the voltage of the gate of each of the first FET 20a and the second FETs 20b, with respect to the potential of the source, is higher than or equal to a certain ON voltage, its state is ON. When the voltage of the gate of each of the first FET 20a and the second FETs 20b, with respect to the potential of the source, is lower than a certain OFF voltage, its state is OFF. The ON voltage is higher than the OFF voltage. The OFF voltage is a positive voltage.

When the DC power supply 12 is in normal connection, the booster circuit 25 boosts the voltage at the positive terminal Tp, with respect to the potential of the cathode of the first diode 26, and outputs the boosted voltage to the first drive circuit 21a and the second drive circuit 21b. The potential of the cathode of the first diode 26 is hereinafter referred to as the diode potential. The voltage boosted by the booster circuit 25 is hereinafter referred to as the boosted voltage. The reference potential of the boosted voltage is the diode potential.

The first drive circuit 21a applies the boosted voltage to the gate of the first FET 20a. As a result, the voltage of the gate of the first FET 20a, with respect to the potential of the source, becomes higher than or equal to the ON voltage to switch ON the first FET 20a. The second drive circuit 21b also applies the boosted voltage to the gate of the second FET 20b. As a result, the voltage of the gate of the second FET 20b, with respect to the potential of the source, becomes higher than or equal to the ON voltage to switch ON the second FET 20b.

The first drive circuit 21a stops applying the boosted voltage and adjusts the potential of the gate of the first FET 20a to the diode potential. As a result, the voltage of the gate of the first FET 20a, with respect to the potential of the source, becomes lower than the OFF voltage and the first FET 20a is switched OFF. The second drive circuit 21b also stops applying the boosted voltage to the second FET 20b and adjusts the potential of the gate of the second FET 20b to the diode potential. As a result, the voltage of the gate of the second FET 20b, with respect to the potential of the source, becomes lower than the OFF voltage and the second FET 20b is switched OFF. As a whole, the first drive circuit 21a and second drive circuit 21b function as a switching circuit.

The microcomputer 23 outputs a voltage to the first filter circuit 22a and the second filter circuit 22b. The reference potential of the output voltage that the microcomputer 23 outputs to the first filter circuit 22a and the second filter circuit 22b is the diode potential. The microcomputer 23 issues instructions to switch ON the first FET 20a and the second FET 20b by switching the output voltage from a low level voltage to a high level voltage. The microcomputer 23 issues instructions to switch OFF the first FET 20a and the second FET 20b by switching the output voltage from the high level voltage to the low level voltage. The high level voltage is, for example, 5V. The low level voltage is lower than the high level voltage, for example, 0V.

A switching instruction to switch ON the first FET 20a and the second FET 20b is hereinafter referred to as an ON instruction. A switching instruction to switch OFF the first FET 20a and the second FET 20b is hereinafter referred to as an OFF instruction.

The first filter circuit 22a and the second filter circuit 22b output a voltage to the first drive circuit 21a and the second drive circuit 21b, respectively. The reference potential of the output voltage of the first filter circuit 22a and the second filter circuit 22b is the diode potential. The output voltage of the first filter circuit 22a is the voltage between the two terminals of the first capacitor 31. The output voltage of the second filter circuit 22b is the voltage between the two terminals of the second capacitor 41.

When the microcomputer 23 switches the output voltage from the low level voltage to the high level voltage, the output voltage of the first filter circuit 22a and the second filter circuit 22b increases. When the output voltage of the first filter circuit 22a becomes higher than or equal to a certain threshold voltage, the first drive circuit 21a receives an ON instruction. The reference potential of the threshold voltage is the diode potential. The threshold voltage is above the low level voltage and below the high level voltage. When the output voltage of the second filter circuit 22b is higher than or equal to the certain threshold voltage, the second drive circuit 21b receives an ON instruction.

When the microcomputer 23 switches the output voltage from the high level voltage to the low level voltage, the output voltage of the first filter circuit 22a and the second filter circuit 22b decreases. When the output voltage of the first filter circuit 22a becomes lower than the certain threshold voltage, the first drive circuit 21a receives an OFF instruction. When the output voltage of the second filter circuit 22b becomes lower than the certain threshold voltage, the second drive circuit 21b receives an OFF instruction.

After the first drive circuit 21a has received an ON instruction, the first drive circuit 21a switches ON the first FET 20a when the voltage at the connection node between the first FET 20a and the second FET 20b is higher than or equal to a certain reference voltage. The voltage at the connection node between the first FET 20a and the second FET 20b is hereinafter referred to as the intermediate voltage. The reference potential of the intermediate voltage is the diode potential. The reference voltage is a positive voltage and corresponds to a second predetermined voltage. When the first drive circuit 21a receives an OFF instruction or when the intermediate voltage becomes lower than the reference voltage, the first drive circuit 21a switches OFF the first FET 20a.

After the second drive circuit 21b has received an ON instruction and when the intermediate voltage is higher than or equal to the reference voltage, the second drive circuit 21b switches ON the second FET 20b. When the second drive circuit 21b receives an OFF instruction or when the intermediate voltage becomes lower than the reference voltage, the second drive circuit 21b switches OFF the second FET 20b.

If the voltage at the positive terminal Tp, with respect to the diode potential, is higher than or equal to the reference voltage, the boosted voltage of the booster circuit 25 is a voltage at which it is possible to switch ON the first FET 20a and the second FET 20b. If the voltage at the positive terminal Tp, with respect to the diode potential, is lower than the reference voltage, the voltage may not be properly boosted at the booster circuit 25, and the boosted voltage may be lower than the voltage at which it is possible to switch ON the first FET 20a and the second FET 20b. In this case, as a result of the application of the boosted voltage by the booster circuit 25, the resistance value between the drain and the source of each of the first FET 20a and the second FET 20b may not decrease to a sufficiently small value.

Operation of First FET 20a

Figure 2:
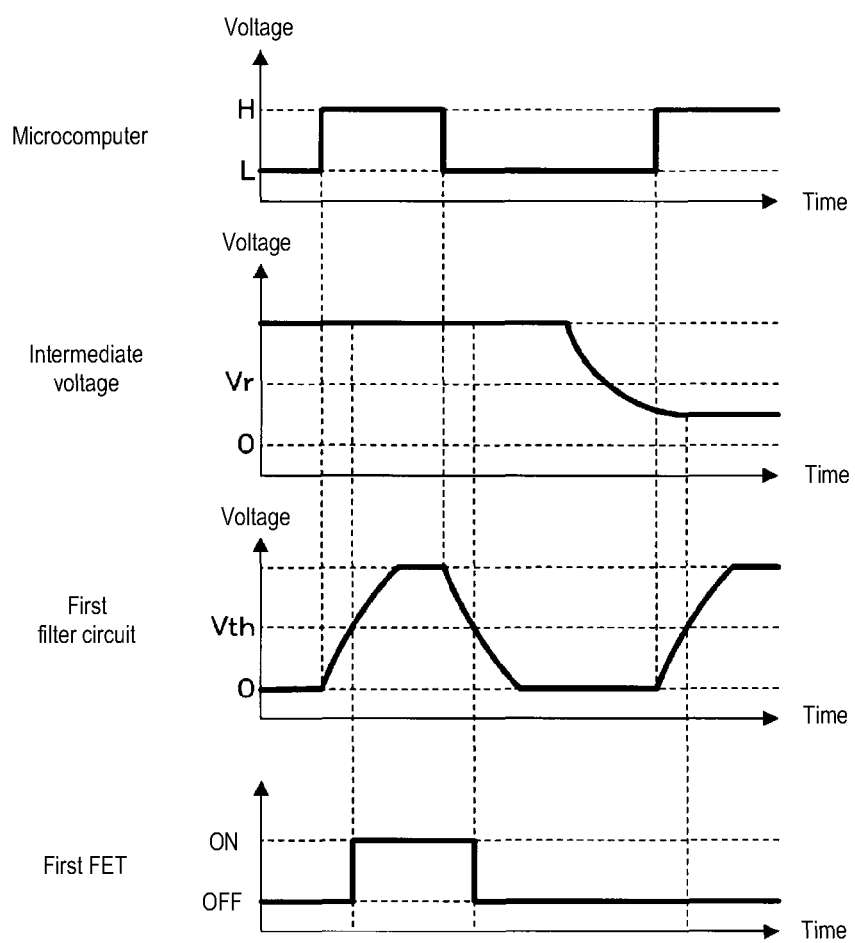
FIG. 2 is a timing chart illustrating the operation of a first FET.

FIG. 2 is a timing chart illustrating the operation of the first FET 20a. FIG. 2 shows the graphs of the output voltage of the microcomputer 23, the intermediate voltage, the output voltage of the first filter circuit 22a, and the state of the first FET 20a. For these graphs, time is plotted on the horizontal axis. In FIG. 2, the high level voltage, low level voltage, reference voltage, and threshold voltage are denoted by H, L, Vr, and Vth, respectively. The reference potential of the output voltage of the first filter circuit 22a shown in FIG. 2 is the diode potential. Each of the graphs shown in FIG. 2 is a graph that occurs when the DC power supply 12 is in normal connection. FIG. 2 shows an example where the low level voltage is 0V.

When the first FET 20a and the second FET 20b are switched OFF, no current flows through the first FET 20a and the second FET 20b, and thus no current flows through the device resistor 24, so that the intermediate voltage matches the voltage at the positive terminal Tp, with respect to the diode potential. The magnitude of the voltage drop that occurs when current flows through the anode and cathode of the first diode 26, in that order, is referred to as the forward voltage. The intermediate voltage is substantially equal to the voltage obtained by subtracting the forward voltage of the first diode 26 from the voltage of the DC power supply 12.

As described above, as the device resistor 24 is connected between the drain and source of the first FET 20a, even if the first FET 20a and the second FET 20b are switched OFF, the intermediate voltage matches the voltage of the positive terminal Tp, with respect to the diode potential.

When the DC power supply 12 is in reverse connection and the first FET 20a and the second FET 20b are switched OFF, current flows through the load 11, a second parasitic diode db, and the device resistor 24 in that order. If the current continues to flow through the second parasitic diode db, the temperature of the second FET 20b may rise to an abnormal level. If the temperature of the second FET 20b rises to an abnormal level, a failure may occur in the second FET 20b. For this reason, a resistor with a very large value of resistance is used as the device resistor 24. In this case, even if the DC power supply 12 is in reverse connection, the current flowing through the second parasitic diode db is practically 0A, and the temperature of the second FET 20b does not rise to an abnormal level.

When the first FET 20a is switched ON, the intermediate voltage also matches the voltage of the positive terminal Tp, with respect to the diode potential. Here, the voltage drop that occurs in the first FET 20a is ignored. Therefore, the intermediate voltage is, at all times, substantially equal to the voltage obtained by subtracting the forward voltage of the first diode 26 from the voltage of the DC power supply 12. Since the forward voltage of the first diode 26 is substantially constant, the intermediate voltage behaves similarly to the voltage of the DC power supply 12. In the example in FIG. 2, the intermediate voltage is initially maintained at a level above the reference voltage Vr. Subsequently, for example, due to a drop in the output voltage of the DC power supply 12, the intermediate voltage is reduced and maintained at a level below the reference voltage Vr.

When the output voltage of the microcomputer 23 is the low level voltage and no power is stored in the first capacitor 31, the output voltage of the first filter circuit 22a is 0V and less than the threshold voltage Vth. When the output voltage of the first filter circuit 22a is lower than the threshold voltage Vth, the first drive circuit 21a maintains the first FET 20a in the OFF state. As described above, the threshold voltage Vth is higher than the low level voltage and lower than the high level voltage.

When the microcomputer 23 switches the output voltage from the low level voltage to the high level voltage, current flows from the microcomputer 23 through the first resistor 30 and to the first capacitor 31, in that order, to charge the first capacitor 31. As a result, the output voltage of the first filter circuit 22a rises with time. If the value of resistance of the first resistor 30 and the capacitance of the first capacitor 31 are denoted as R1 and C1, respectively, the smaller the first time constant expressed as R1·C1 is, the faster the rate of rise of the output voltage of the first filter circuit 22a becomes. Here, the symbol "·" denotes the product.

As described above, when the output voltage of the first filter circuit 22a becomes higher than or equal to the certain threshold voltage Vth, the first drive circuit 21a receives an ON instruction. When receiving an ON instruction with the intermediate voltage higher than or equal to the reference voltage Vr, the first drive circuit 21a can switch ON the first FET 20a by applying the voltage boosted by the booster circuit 25, thus applying the boosted voltage to the gate of the first FET 20a. In this way, the first FET 20a is switched ON. When the output voltage of the first filter circuit 22a has reached the high level voltage, the charging of the first capacitor 31 is terminated. After the charging is terminated, the output voltage of the first filter circuit 22a is maintained at the high level voltage while the output voltage of the microcomputer 23 is at the high level voltage.

When the microcomputer 23 switches the output voltage from the high level voltage to the low level voltage, current flows from first capacitor 31 through the first resistor 30 and to the microcomputer 23, in that order, to discharge the first capacitor 31. As a result, the output voltage of the first filter circuit 22a is reduced with time. The smaller the first time constant is, the faster the rate of reduction in the output voltage of the first filter circuit 22a is. When the output voltage of the first filter circuit 22a goes below the threshold voltage Vth, the first drive circuit 21a receives an OFF instruction and switches OFF the first FET 20a.

As mentioned above, when the first drive circuit 21a receives an OFF instruction or when the intermediate voltage becomes lower than the reference voltage Vr, the first drive circuit 21a switches OFF the first FET 20a. Therefore, when the intermediate voltage becomes lower than the reference voltage Vr with the output voltage of the first filter circuit 22a higher than or equal to the threshold voltage Vth, the first drive circuit 21a also switches OFF the first FET 20a.

The discharge of the first capacitor 31 is terminated when the output voltage of the first filter circuit 22a reaches 0V (the low level voltage). After the discharge is terminated, the output voltage of the first filter circuit 22a is maintained at 0V while the output voltage of the microcomputer 23 is at the low level voltage.

Operation of Second FET 20b

The output voltage of the second filter circuit 22b behaves in the same manner as that of the first filter circuit 22a. When the microcomputer 23 switches the output voltage from the low level voltage to the high level voltage, current flows from the microcomputer 23 through the second resistor 40 and to the second capacitor 41, in that order, to charge the second capacitor 41. As a result, the output voltage of the second filter circuit 22b rises with time.

If the value of resistance of the second resistor 40 and the capacitance of the second capacitor 41 are denoted as R2 and C2, respectively, the smaller the second time constant expressed as R2·C2 is, the faster the rate of rise of the output voltage of the second filter circuit 22b becomes. When the output voltage of the second filter circuit 22b has reached the high level voltage, the charging of the second capacitor 41 is terminated. The first time constant is smaller than the second time constant. Therefore, the rate of rise of the output voltage of the second filter circuit 22b is lower than the rate of rise of the output voltage of the first filter circuit 22a.

When the microcomputer 23 switches the output voltage from the high level voltage to the low level voltage, current flows from second capacitor 41 through the circuit diode 42 and to the microcomputer 23, in that order, to discharge the second capacitor 41. As a result, the output voltage of the second filter circuit 22b is reduced with time. When the second capacitor 41 discharges, the current flows through the circuit diode 42, so that the output voltage of the second filter circuit 22b drops faster than the output voltage of the first filter circuit 22a. The discharge of the second capacitor 41 is terminated when the output voltage of the second filter circuit 22b reaches 0V (the low level voltage).

As described above, when the output voltage of the second filter circuit 22b becomes lower than the certain threshold voltage Vth, the second drive circuit 21b receives an OFF instruction. The second drive circuit 21b operates in the same manner as the first drive circuit 21a. Accordingly, when the second drive circuit 21b receives an OFF instruction and the intermediate voltage is higher than or equal to the reference voltage Vr, as it is possible to switch ON the second FET 20b by applying the voltage boosted by the booster circuit 25, the second drive circuit 21b applies the boosted voltage to the gate of the second FET 20b. In this way, the second FET 20b is switched ON. When the output voltage of the second filter circuit 22b becomes lower than the threshold voltage Vth or when the intermediate voltage becomes lower than the reference voltage Vr, the second drive circuit 21b switches OFF the second FET 20b.

Switching Timing of First FET 20a and Second FET 20b

Figure 3:
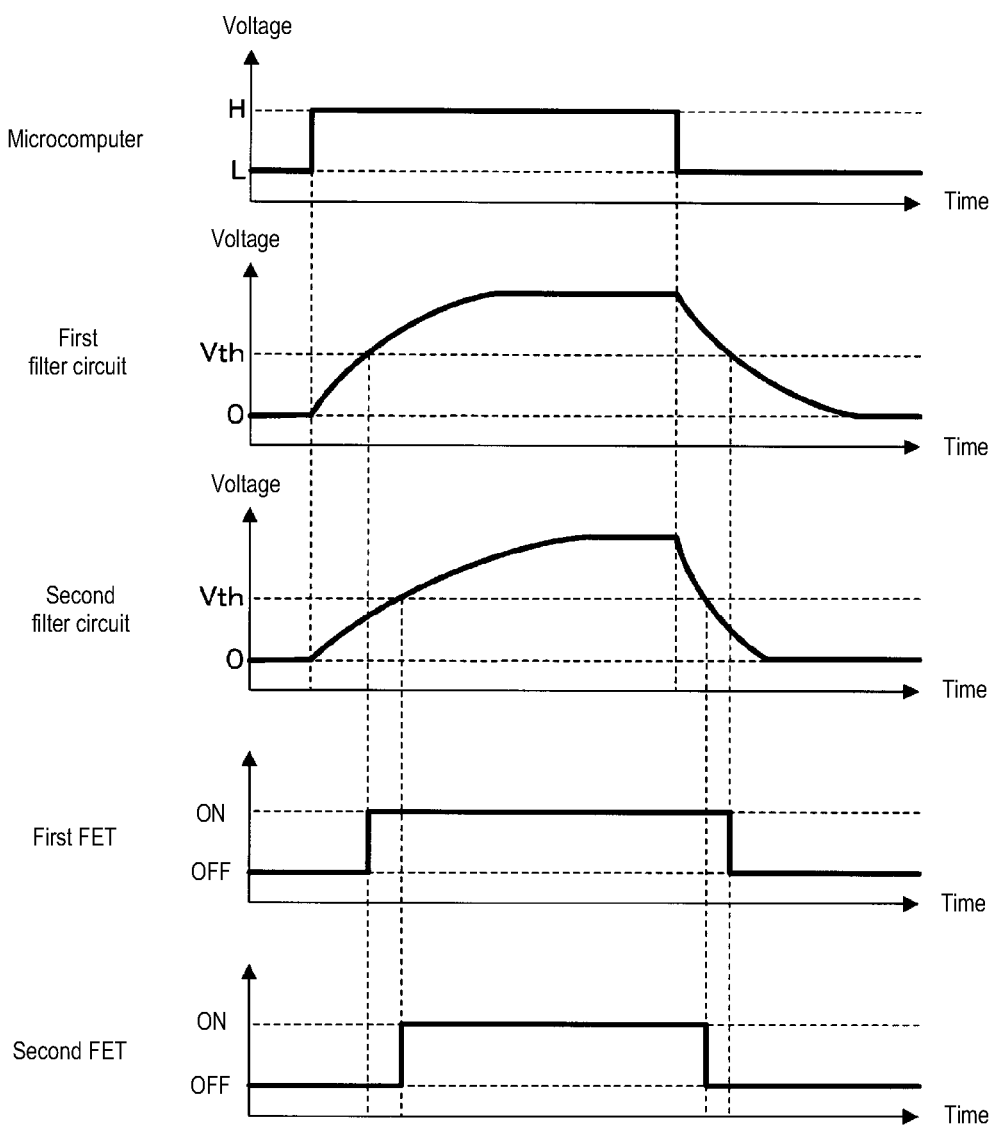
FIG. 3 is a timing chart illustrating the switching timing of the first FET and the second FET.

FIG. 3 is a timing chart illustrating the switching timing of the first FET 20a and the second FET 20b. FIG. 3 shows the graphs of the output voltage of the microcomputer 23, the output voltage of the first filer circuit 22a, the output voltage of the second filter circuit 22b, the state of the first FET 20a, and the state of the second FET 20b. In these graphs, time is plotted on the horizontal axis. In FIG. 3, as in FIG. 2, the high level voltage, low level voltage, reference voltage, and threshold voltage are denoted by H, L, and Vth, respectively. The following describes the switching timing of the first FET 20a and the second FET 20b when the DC power supply 12 is in normal connection and the intermediate voltage is higher than or equal to the reference voltage.

When the microcomputer 23 issues instructions to switch ON the first FET 20a and the second FET 20b, i.e., when the microcomputer 23 switches the output voltage from the low level voltage to the high level voltage, the output voltage of the first filer circuit 22a and the second filter circuit 22b rises as described above. As the first time constant is smaller than the second time constant, the rate of rise of the output voltage of the first filter circuit 22a is higher than the rate of rise of the output voltage of the second filter circuit 22b. Accordingly, the output voltage of the first filter circuit 22a exceeds the threshold voltage Vth faster than the output voltage of the second filter circuit 22b. As such, when the microcomputer 23 issues instructions to switch ON the first FET 20a and the second FET 20b, the first FET 20a is switched ON by the first drive circuit 21a faster than is the second FET 20b. After the first FET 20a is switched ON, the second drive circuit 21b switches ON the second FET 20b.

When the DC power supply 12 is in normal connection and the first FET 20a and the second FET 20b are switched OFF and ON, respectively, current flows through the first parasitic diode Da, the second FET 20b, and the load 11, in that order. If the current continues to flow through the first parasitic diode Da, the temperature of the first FET 20a may rise to an abnormal level. In this case, a failure might occur in the first FET 20a. However, as the first FET 20a is switched ON before the second FET 20b is, no current flows through the first parasitic diode Da in the process of switching ON the first FET 20a and the second FET 20b.

When the microcomputer 23 issues instructions to switch OFF the first FET 20a and the second FET 20b, i.e., when the microcomputer 23 switches the output voltage from the high level voltage to the low level voltage, the output voltage of the first filer circuit 22a and the second filter circuit 22b is reduced as described above. In the second filter circuit 22b, as the second capacitor 41 discharges through the circuit diode 42, the output voltage of the first filter circuit 22a drops slower than the output voltage of the second filter circuit 22b. Accordingly, the output voltage of the first filter circuit 22a becomes lower than the threshold voltage Vth after the output voltage of the second filter circuit 22b. As such, when the microcomputer 23 issues instructions to switch OFF the first FET 20a and the second FET 20b, the second FET 20b is switched OFF first by the second drive circuit 21b. After the second FET 20b is switched OFF, the first FET 20a is switched OFF by the first drive circuit 21a.

As described above, when the DC power supply 12 is in normal connection and the first FET 20a and the second FET 20b are switched OFF and ON, respectively, current flows through the first parasitic diode Da. However, as the first FET 20a is switched OFF after the second FET 20b is, no current flows through the first parasitic diode Da in the process of switching ON the first FET 20a and the second FET 20b.

Configuration of First Drive Circuit 21a

Figure 4:
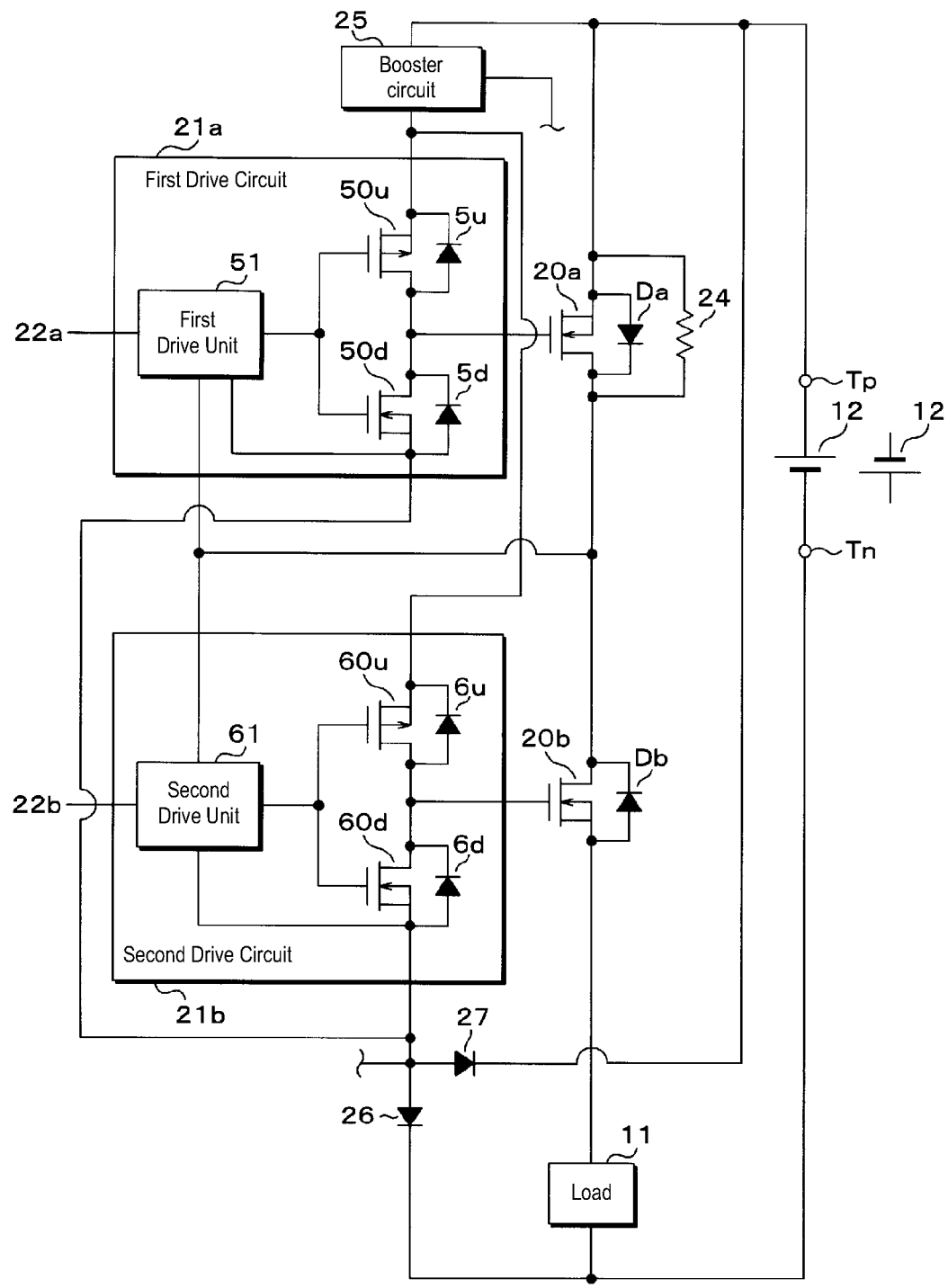
FIG. 4 is a circuit diagram of a first drive circuit and a second drive circuit.

FIG. 4 is a circuit diagram of the first drive circuit 21a and the second drive circuit 21b. The first drive circuit 21a includes an upper FET 50u, a lower FET 50d, and a first drive unit 51. The upper FET 50u is a P-channel MOSFET. The lower FET 50d is an N-channel MOSFET. An upper parasitic diode 5u is formed in the upper FET 50u, with its cathode and anode connected to the source and the drain, respectively. A lower parasitic diode 5d is formed in the lower FET 50d, with its cathode and anode connected to the drain and the source, respectively.

The source of the upper FET 50u is connected to the output terminal of the booster circuit 25. Therefore, the voltage at the source of the upper FET 50u, with respect to the diode potential, is the boosted voltage. The drain of the upper FET 50u is connected to the drain of the lower FET 50d. The source of the lower FET 50d is connected to the anode of the first diode 26. The connection node between the drains of the upper FET 50u and the lower FET 50d is connected to the gate of the first FET 20a. The gate of the upper FET 50u is connected to the gate of the lower FET 50d. The connection node between the gates of the upper FET 50u and the lower FET 50d is connected to the first drive unit 51. Additionally, the first drive unit 51 is connected to the connection node between the first resistor 30 and the first capacitor 31 included in the first filter circuit 22a, to the source of the lower FET 50d, and to the connection node between the first FET 20a and the second FET 20b.

The upper FET 50u and the lower FET 50d each function as a switch. When the state of each of upper FET 50u and the lower FET 50d is ON, the value of resistance between the drain and the source is sufficiently small to allow current to flow through the drain and the source. When the state of each of upper FET 50u and the lower FET 50d is OFF, the value of resistance between the drain and the source is too great to allow current to flow through the drain and the source. The value of resistance between the drain and the source of each of the upper FET 50u and the lower FET 50d varies depending on the voltage of the gate, with respect to the potential of the source.

When the voltage of the gate of the upper FET 50u, with respect to the potential of the source, is lower than a certain second ON voltage, its state is ON. When the voltage of the gate of the upper FET 50u, with respect to the potential of the source, is higher than or equal to a certain second OFF voltage, its state is OFF. The second ON voltage is lower than the second OFF voltage. The second OFF voltage is a negative voltage.

When the voltage of the gate of the lower FET 50d, with respect to the potential of the source, is higher than or equal to a certain third ON voltage, its state is ON. When the voltage of the gate of the lower FET 50d, with respect to the potential of the source, is lower than a certain third OFF voltage, its state is OFF. The third ON voltage is above the third OFF voltage. The third OFF voltage is a positive voltage.

The operation of the first drive unit 51 when the DC power supply 12 is in normal connection is now described. When the output voltage of the first filter circuit 22a is higher than or equal to the threshold voltage with the intermediate voltage higher than or equal to the reference voltage, the first drive unit 51 reduces the gate voltage of the upper FET 50u and lower FET 50d. Here, the reference potential of the gate voltage is the diode potential. When the voltage of the gates of the upper FET 50u and lower FET 50d are reduced, in the upper FET 50u, the voltage of the gate, with respect to the potential of the source, is reduced to less than the second ON voltage, and in the lower FET 50d, the voltage of the gate, with respect to the potential of the source, is reduced to less than the third OFF voltage. As a result, the upper FET 50u and the lower FET 50d are switched ON and OFF, respectively. As a result, the voltage boosted by the booster circuit 25 is applied to the gate of the first FET 20a via the upper FET 50u to switch ON the first FET 20a.

When the output voltage of the first filter circuit 22a is lower than the threshold voltage, or when the intermediate voltage is lower than the reference voltage, the first drive unit 51 increases the gate voltage of the upper FET 50u and lower FET 50d. Here, the reference potential of the gate voltage is the diode potential. When the voltage of the gates of the upper FET 50u and lower FET 50d increases, in the upper FET 50u, the voltage of the gate, with respect to the potential of the source, rises to the second ON voltage or higher, and in the lower FET 50d, the voltage of the gate, with respect to the potential of the source, rises to the third OFF voltage or higher. As a result, the upper FET 50u and the lower FET 50d are switched OFF and ON, respectively. Accordingly, the application of the boosted voltage is stopped and the potential of the gate of the first FET 20a is adjusted to the diode potential. As a result, the first FET 20a is switched OFF.

As described above, when the DC power supply 12 is in normal connection, the first drive unit 51 switches ON the first FET 20a by switching ON and OFF the upper FET 50u and the lower FET 50d, respectively. Furthermore, the first drive unit 51 switches OFF the first FET 20a by switching OFF and ON the upper FET 50u and the lower FET 50d, respectively. When the DC power supply 12 is in reverse connection, the first drive unit 51 maintains the upper FET 50u and the lower FET 50d in the OFF state. For example, the upper FET 50u and the lower FET 50d are switched OFF by adjusting to 0V the voltage between the gate and source of each of the upper FET 50u and lower FET 50d.

Configuration of Second Drive Circuit 21b

The first drive circuit 21a includes an upper FET 60u, a lower FET 60d, and a second drive unit 61. The upper FET 60u is a P-channel MOSFET. The lower FET 60d is an N-channel MOSFET. An upper parasitic diode 6u is formed in the upper FET 60u with its cathode and anode connected to the source and the drain, respectively. A lower parasitic diode 6d is formed in the lower FET 60d with its cathode and anode connected to the drain and the source, respectively.

The source of the upper FET 60u is connected to the output terminal of the booster circuit 25. Therefore, the voltage at the source of the upper FET 60u, with respect to the diode potential, is the boosted voltage. The drain of the upper FET 60u is connected to the drain of the lower FET 60d. The source of the lower FET 60d is connected to the anode of the first diode 26. The connection node between the gates of the upper FET 60u and the lower FET 60d is connected to the gate of the second FET 20b. The gate of the upper FET 60u is connected to the gate of the lower FET 60d. The connection node between the gates of the upper FET 60u and the lower FET 60d is connected to the second drive unit 61. Additionally, the second drive unit 61 is connected to the connection node between the second resistor 40 and the second capacitor 41 included in the second filter circuit 22b, to the source of the lower FET 60d, and to the connection node between the first FET 20a and the second FET 20b.

The upper FET 60u and the lower FET 60d are configured in the same manner as the upper FET 50u and lower FET 50d, respectively. When the DC power supply 12 is in normal connection, the second drive unit 61 switches ON or OFF each of the upper FET 60u and lower FET 60d in the same manner as the first drive unit 51.

Accordingly, when the output voltage of the second filter circuit 22b is higher than or equal to the threshold voltage with the intermediate voltage higher than or equal to the reference voltage, the second drive unit 61 switches ON and OFF the upper FET 60u and lower FET 60d, respectively. As a result, the boosted voltage is applied to the gate of the second FET 20b and the first FET 20a is switched ON. The second FET 20b is switched ON. When the output voltage of the second filter circuit 22b is lower than the threshold voltage or when the intermediate voltage is lower than the reference voltage, the second drive unit 61 switches OFF and ON the upper FET 60u and lower FET 60d, respectively. Accordingly, the application of the boosted voltage is stopped and the potential of the gate of the second FET 20b is adjusted to the diode potential. As a result, the second FET 20b is switched OFF. When the DC power supply 12 is in reverse connection, the second drive unit 61 maintains the upper FET 60u and lower FET 60d in the OFF state.

Effect of First Diode 26

Figure 5:
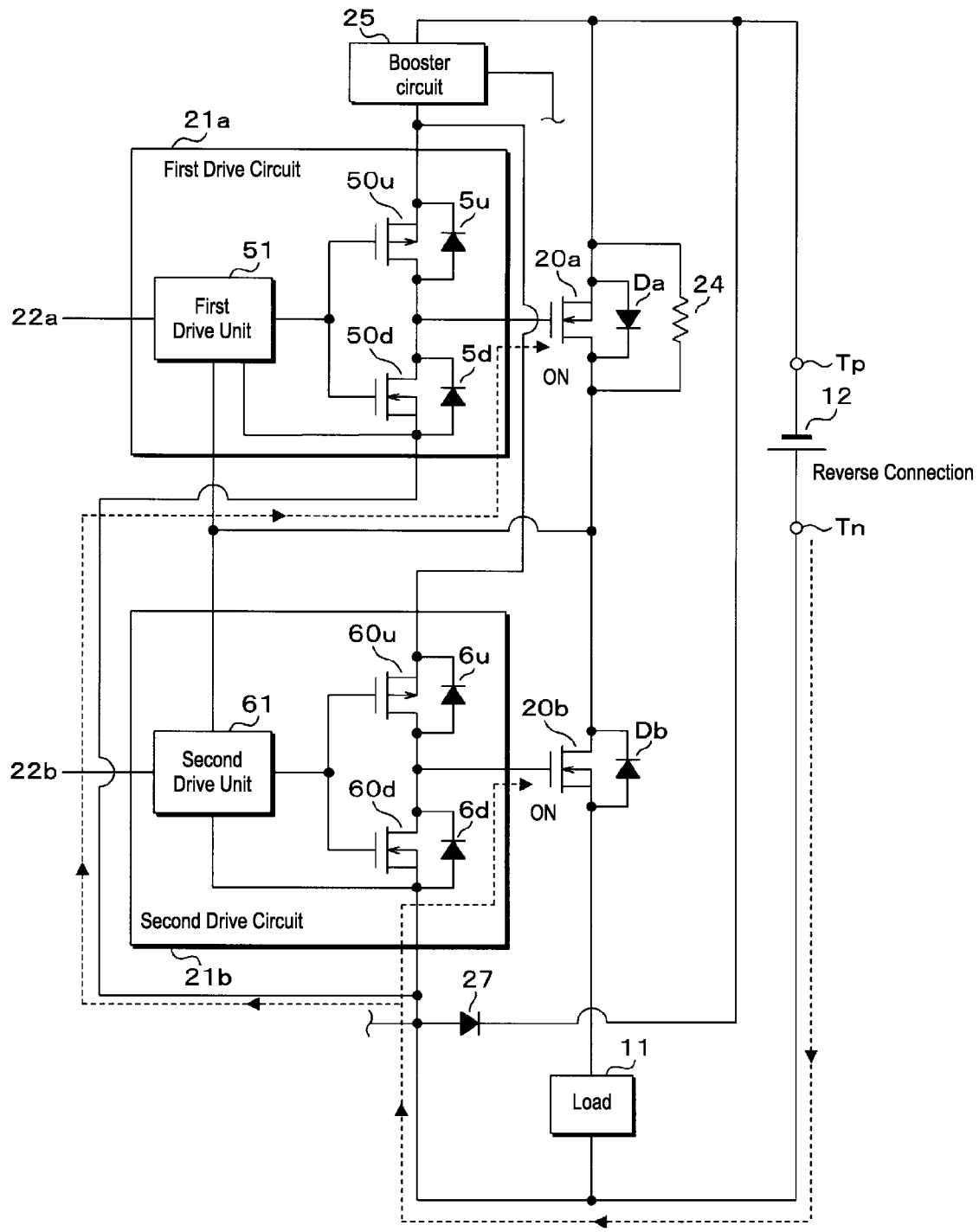
FIG. 5 is an explanatory view of the effect of a first diode.

FIG. 5 is an explanatory view of the effect of the first diode 26. FIG. 5 shows a configuration of the power feeding control device 10 from which the first diode 26 is omitted. Specifically, this configuration is a configuration of the power feeding control device 10 in which both ends of the first diode 26 are shorted. In this configuration, as shown in FIG. 5, when the DC power supply 12 is in reverse connection, the voltage of the DC power supply 12 is applied to the gate of the first FET 20a via the lower parasitic diode 5d and to the gate of the second FET 20b via the lower parasitic diode 6d. Accordingly, the voltage at the gate, with respect to the potential of the source, increases in each of the first FET 20a and second FET 20b, and the value of resistance between drain and source decreases in each of the first FET 20a and second FET 20b. Accordingly, current may flow through the first FET 20a and the second FET 20b.

When current flows through the first FET 20a and the second FET 20b with the DC power supply 12 in reverse connection, the current flows from the negative terminal Tn, through the load 11, through the second FET 20b, through the first FET 20a, and to the positive terminal Tp in that order. This may cause the load 11 to operate improperly. For example, if the load 11 is a motor, the motor may rotate in a direction different from the normal direction.

However, since the power feeding control device 10 shown in FIG. 1 has the first diode 26, when the DC power supply 12 is in reverse connection, the voltage of the DC power supply 12 is not applied to the gates of the first FET 20a and the second FET 20b via the first drive circuit 21a and the second drive circuit 21b, respectively. As described above, when the DC power supply 12 is in reverse connection, the upper FETs 50u, 60u and the lower FETs 50d, 60d are switched OFF. The gate of each of the first FET 20a and the second FET 20b is, for example, connected to the cathode of the first diode 26 via two resistors not shown in the drawings. Therefore, when the voltage of the DC power supply 12 is not applied to the gates of the first FET 20a and the second FET 20b, the voltage of the gates, with respect to the diode potential, is low in the first FET 20a and the second FET 20b, and the first FET 20a and second FET 20b remains OFF.

Additionally, as shown in FIG. 1, the cathode and the anode of the second diode 27 are connected to the positive terminal Tp and the anode of the first diode 26, respectively. Therefore, even if the DC power supply 12 is in reverse connection, the voltage between the negative pole of the DC power supply 12 and the anode of the first diode 26 is stabilized.

Note

The threshold voltage of the output voltage of the first filter circuit 22a may be different from the threshold voltage of the output voltage of the second filter circuit 22b. The first time constant may be greater than or equal to the second time constant. As long as the first FET 20a is configured to switch ON before the second FET 20b, and the first FET 20a is configured to switch OFF after the second FET 20b, the threshold voltages, the first time constant, and the second time constant may be set to any values. For example, the first time constant is the same as the second time constant, the threshold voltage of the output voltage of the first filter circuit 22a is set below the threshold voltage of the output voltage of the second filter circuit 22b. This allows for the implementation of the configuration described above.

Embodiment 2

In Embodiment 1, even if the DC power supply 12 is in reverse connection, the second diode 27 is used to stabilize the voltage between the negative pole of the DC power supply 12 and the cathode of the first diode 26. However, elements that may be used to stabilize the voltage between the negative pole of the DC power supply 12 and the cathode of the first diode 26 even if the DC power supply 12 is in reverse connection are not limited to the second diode 27.

The following describes the specifics of Embodiment 2 that differ from Embodiment 1. It is identical to Embodiment 1 except for the configurations described below. As such, identical reference symbols used in Embodiment 1 are assigned to components identical to those of Embodiment 1, and their description is omitted.

Configuration of Power Feeding Control Device 10

Figure 6:
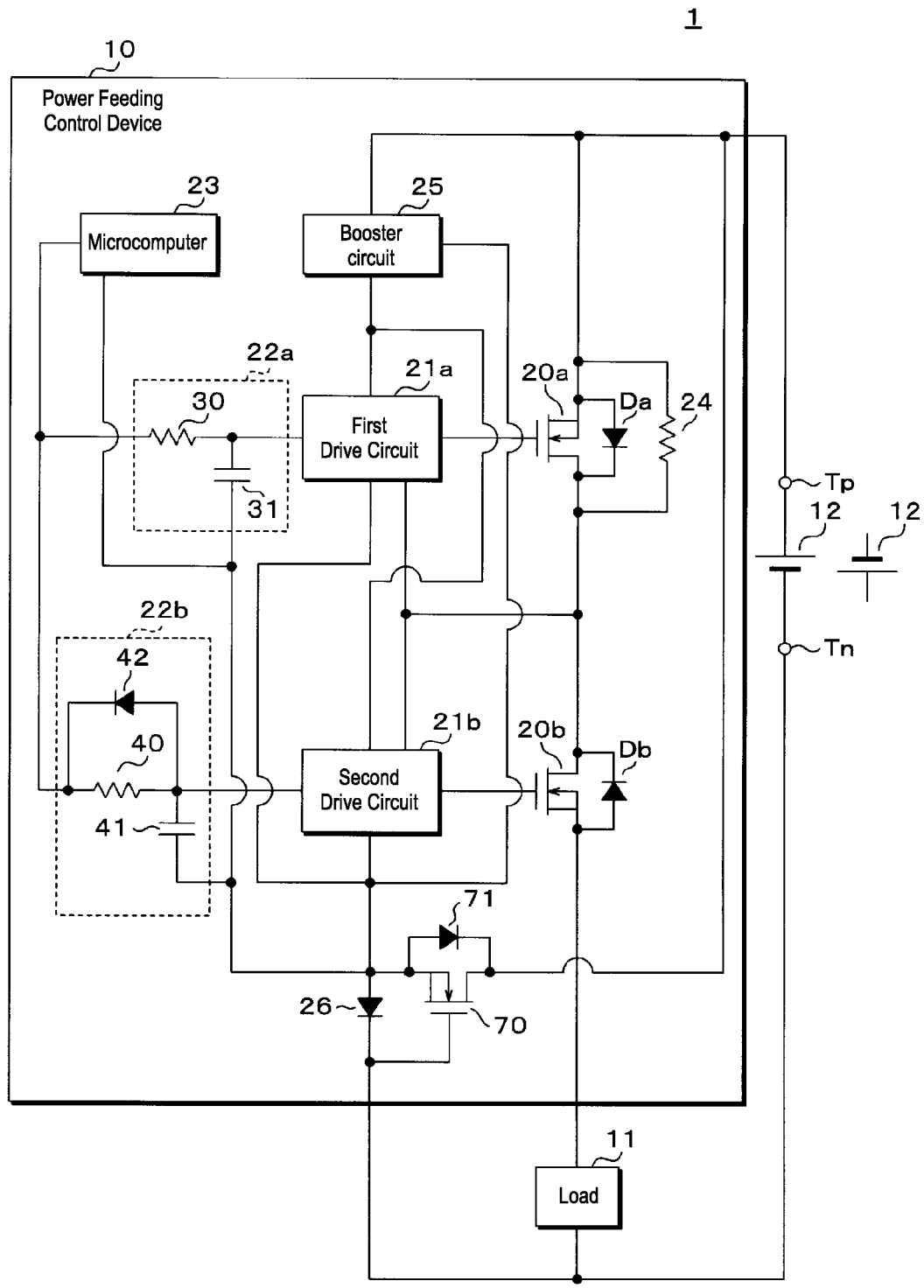
FIG. 6 is a block diagram illustrating the configuration of a main section of a power supply system according to an Embodiment 2.

FIG. 6 is a block diagram illustrating the configuration of a main section of a power supply system 1 of Embodiment 2. When the power supply system 1 of Embodiment 2 is compared with the power supply system 1 of Embodiment 1, the configuration of the power feed control device 10 is different. The power feeding control device 10 of Embodiment 2 includes all the components included in the power feeding control device 10 of Embodiment 1 except for the second diode 27. The power feeding control device 10 of Embodiment 2 includes a switch 70 in place of the second diode 27.

The switch 70 is an N-channel MOSFET. A MOSFET is a semiconductor switch. A parasitic diode 71 is formed in the switch 70, with its cathode and anode connected to the drain and the source, respectively. The drain, the source, and the gate of the switch 70 are connected to the positive terminal Tp, the anode of the first diode 26, and the negative terminal Tn, respectively.

When the state of the switch 70 is ON, the value of resistance between the drain and the source is sufficiently small to allow current to flow through the drain and the source. When the state of the switch 70 is OFF, the value of resistance between the drain and the source is too great to allow current to flow through the drain and the source. When the voltage of the gate of the switch 70, with respect to the potential of the source, is higher than or equal to a certain fourth ON voltage, its state is ON. When the voltage of the gate of the switch 70, with respect to the potential of the source, is higher than or equal to a certain fourth OFF voltage, its state is ON. The fourth ON voltage is above the fourth OFF voltage. The fourth OFF voltage is a positive voltage. The potential of the source of the switch 70 is the potential of the anode of the first diode 26. The gate of the switch 70 functions as a control terminal. The fourth ON voltage correspond to a predetermined voltage.

When the DC power supply 12 is in normal connection, current flows through the anode and the cathode of the first diode 26 in that order. Therefore, the voltage of the gate of the switch 70, with respect to the potential of the source, is a negative voltage and lower than the fourth OFF voltage. Therefore, when the DC power supply 12 is in normal connection, the switch 70 is OFF.

When the DC power supply 12 is in reverse connection, the voltage of the source of the switch 70, with respect to the drain, is the voltage of the DC power supply 12. At this moment, the voltage of the gate of the switch 70, with respect to the potential of the source, is greater than or equal to the fourth ON voltage, and the switch 70 is ON. As such, the cathode of the first cathode 26 is connected to the positive terminal Tp, i.e., the negative terminal, of the DC power supply 12. Accordingly, even if the DC power supply 12 is in reverse connection, the voltage of the anode of the first diode 26, with respect to the potential of the negative pole of the DC power supply 12, is fixed at 0V and stabilized.

Power Feeding Control Device 10

The power feed control apparatus 10 of Embodiment 2 provides the same effects as the power feed control apparatus 10 of Embodiment 1, except for the effects obtained by using the second diode 27.

Note

In Embodiment 2, the switch 70 is not limited to an N-channel MOSFET; for example, it may be an IGBT (Insulated Gate Bipolar Transistor). In this case, the collector, the emitter and the gate of the switch 70 may be connected to, for example, the anode of first diode 26, the positive terminal Tp, and the negative terminal Tn. Furthermore, the switch 70 is not limited to a semiconductor switch, but may be a relay contact, for example.

Embodiment 3

In Embodiment 1, the first FET 20a is located upstream of the second FET 20b in the current path for current flowing from the positive terminal Tp to the negative terminal Tn.

However, where the first FET 20*a* is placed is not limited to the upstream of the second FET 20*b*.

The following describes the specifics of Embodiment 3 that differ from Embodiment 1. It is identical to Embodiment 1 except for the configurations described below. As such, identical reference symbols used in Embodiment 1 are assigned to components identical to those of Embodiment 1, and their description is omitted.

Configuration of Power Feeding Control Device 10

Figure 7:
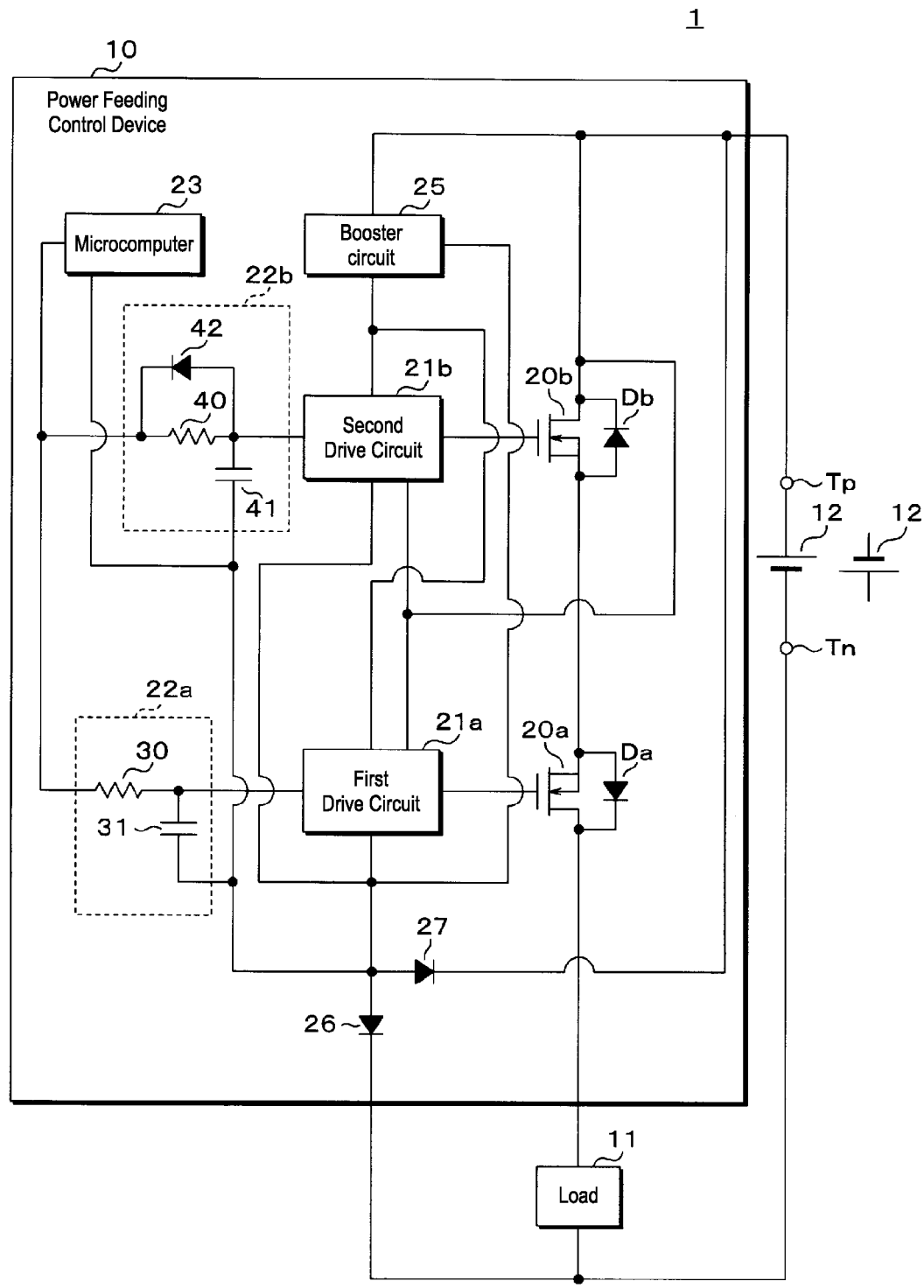
FIG. 7 is a block diagram illustrating the configuration of a main section of a power supply system according to an Embodiment 3.

FIG. 7 is a block diagram illustrating the configuration of a main section of a power supply system 1 of an Embodiment 3. When the power supply system 1 of Embodiment 3 is compared with the power supply system 1 of Embodiment 1, the configuration of the power feed control device 10 is different. The power feeding control device 10 of Embodiment 3 includes all the components included in the power feeding control device 10 of Embodiment 1 except for the device resistor 24.

In Embodiment 3, the drain and the source of the first FET 20*a* are connected to the positive terminal Tp and the source of the second FET 20*b*, respectively. The drain of the second FET 20*b* is connected to one end of the load 11. When the first FET 20*a* and the second FET 20*b* are switched ON with the DC power supply 12 in normal connection, current flows from the positive terminal Tp to the second FET 20*b*, to the first FET 20*a*, to the load 11, and to the negative terminal Tn in that order. Therefore, the first FET 20*a* is located downstream of the second FET 20*b* in the current path for current flowing from the positive terminal Tp to the negative terminal Tn. Furthermore, in Embodiment 3, the first drive circuit 51 of the first drive circuit 21*a* and the second drive unit 61 of the second drive circuit 21*b* are connected to the positive terminal Tp instead of to the connection node between the first FET 20*a* and the second FET 20*b*.

In Embodiment 1, the intermediate voltage matches the positive terminal Tp, with respect to the diode potential. Instead of monitoring the intermediate voltage, each of the first drive 51 and the second drive unit 61 of Embodiment 4 directly monitors the voltage at the positive terminal Tp, with respect to the diode potential, and switch ON or OFF the voltage of the first FET 20*a* and the second FET 20*b* as in Embodiment 1.

Therefore, when the DC power supply 12 is in normal connection, the first drive unit 51 operates as below. When the output voltage of the first filter circuit 22*a* becomes higher than or equal to the threshold voltage with the voltage of the positive terminal Tp, with respect to the diode potential, being higher than or equal to the reference voltage, the first drive unit 51 switches ON and OFF the upper FET 50*u* and the lower FET 50*d*, respectively. As a result, the boosted voltage is applied to the gate of the first FET 20*a* and the first FET 20*a* is switched ON. When the output voltage of the first filter circuit 22*a* becomes lower than the threshold voltage, or when the voltage of the positive terminal Tp, with respect to the diode potential, becomes lower than the reference voltage, the first drive unit 51 switches OFF and ON the upper FET 50*u* and the lower FET 50*d*, respectively. Accordingly, the application of the boosted voltage is stopped and the potential of the gate of the first FET 20*a* is adjusted to the diode potential. As a result, the first FET 20*a* is switched OFF. When the DC power supply 12 is in reverse connection, the first drive unit 51 maintains the upper FET 50*u* and the lower FET 50*d* in the OFF state as in Embodiment 1.

When the DC power supply 12 is in normal connection, the second drive unit 61 operates the same manner as the first drive unit 51 when the DC power supply 12 is in normal connection. Here, the second FET 20*b*, the upper FET 60*u*, and the lower FET 60*d* correspond the first FET 20*a*, the upper FET 50*u*, and lower FET 50*d*, respectively. When the DC power supply 12 is in reverse connection, the second drive unit 61 maintains the upper FET 60*u* and the lower FET 60*d* in the OFF state as in Embodiment 1.

Effect of First Diode 26

Assume that the DC power supply 12 is in reverse connection with the first diode 26 omitted, that is, with both ends of the first diode 26 shorted in the power feeding control device 10 of Embodiment 3. In this case, as described in the description of Embodiment 1, the voltage of the DC power supply 12 is applied to the gates of the first FET 20*a* and the second FET 20*b*, the value of resistance between the drain and the source is reduced in each of the first FET 20*a* and the second FET 20*b*, and current may flow through the first FET 20*a* and the second FET 20*b*. As a result, the load 11 may operate improperly. However, since the power feeding control device 10 of Embodiment 3 has the first diode 26, when the DC power supply 12 is in reverse connection, the voltage of the DC power supply 12 is not applied to the gates of the first FET 20*a* and the second FET 20*b* via the first drive circuit 21*a* and the second drive circuit 21*b*, respectively.

As described above, when the DC power supply 12 is in reverse connection, the upper FETs 50*u*, 60*u* and the lower FETs 50*d*, 60*d* are switched OFF. The gate of each of the first FET 20*a* and the second FET 20*b* is, for example, connected to the cathode of the first diode 26 through two resistors not shown in the drawings. Therefore, when the voltage of the DC power supply 12 is not applied to the gates of the first FET 20*a* and the second FET 20*b*, the voltage of the gates, with respect to the diode potential, is low in the first FET 20*a* and the second FET 20*b*, and the first FET 20*a* and second FET 20*b* remains OFF.

Effects of Power Feed Control System 10 and Note

The power feeding control device 10 of Embodiment 3 provides the same effects as the power feeding control device 10 of Embodiment 1.

In Embodiment 3, as in Embodiment 2, the switch 70 may be used in place of the second diode 27. In this case, the power feeding control device 10 of Embodiment 3 provides the same effects as the power feeding control device 10 of Embodiment 2.

Embodiment 4

In Embodiment 1, the first FET 20*a* and the second FET 20*b* are located upstream of the load 11 in the current path for current flowing from the positive terminal Tp to the negative terminal Tn. However, the first FET 20*a* and the second FET 20*b* may be located downstream of the load 11.

The following describes the specifics of Embodiment 4 that differ from Embodiment 1. It is identical to Embodiment 1 except for the configurations described below. As such, identical reference symbols used in Embodiment 1 are assigned to components identical to those of Embodiment 1, and their description is omitted.

Configuration of Power Supply System 1

Figure 8:
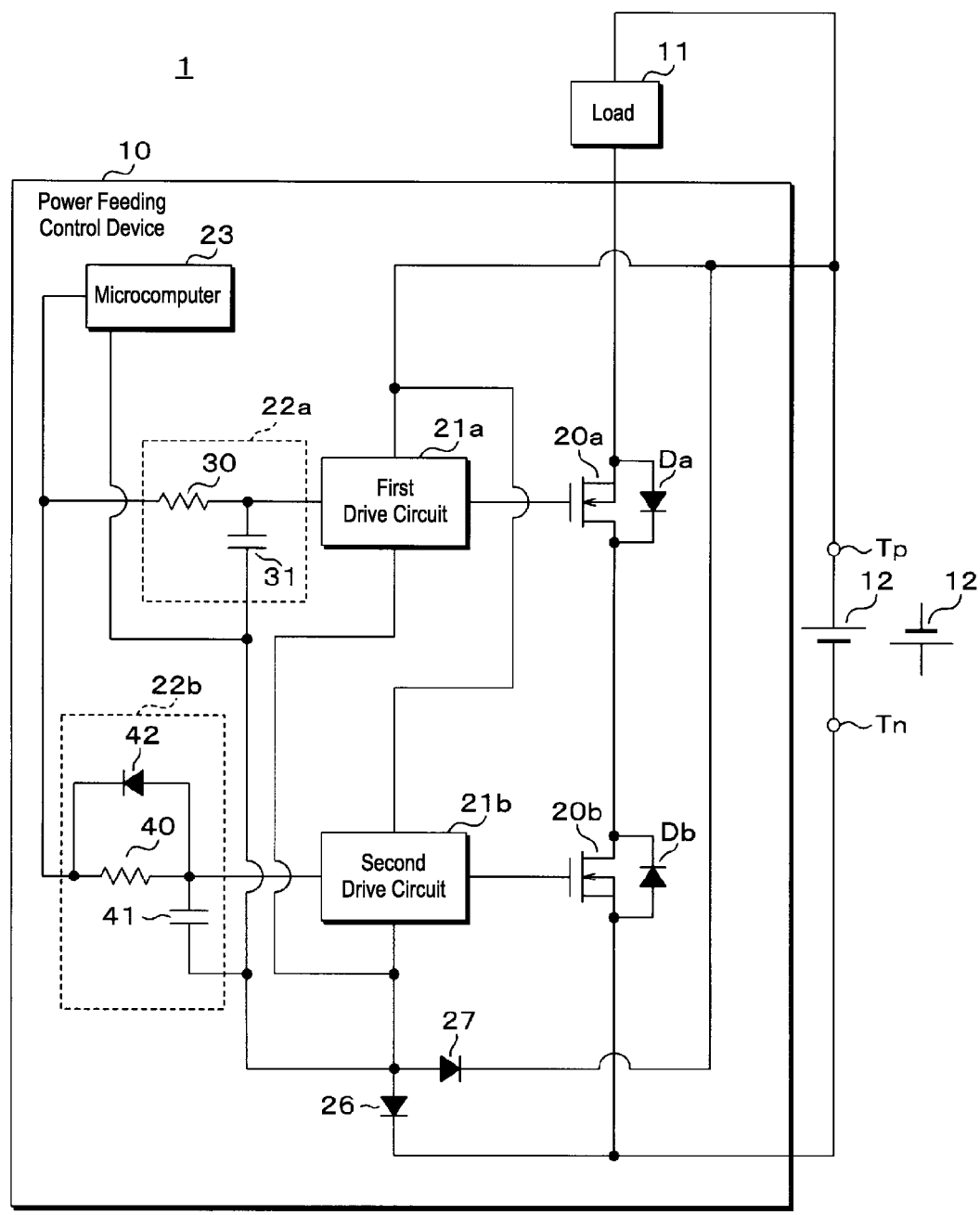
FIG. 8 is a block diagram illustrating the configuration of a main section of a power supply system according to an Embodiment 4.

FIG. 8 is a block diagram illustrating the configuration of a main section of a power supply system 1 of an Embodiment 4. When the power supply system 1 of Embodiment 4 is compared with the power supply system 1 of Embodiment 1, the location of the load 11 is different. The positive terminal Tp is connected to one end of the load 11. The other end of the load 11 is connected to the source of the first FET 20*a*. The source of the second FET 20*b* is connected to the negative terminal Tn.

When the first FET 20*a* and the second FET 20*b* are switched ON with the DC power supply 12 in normal connection, current flows from the positive terminal Tp to the load 11, to the first FET 20*a*, and to the second FET 20*b* in that order. As a result, power is supplied from the DC power supply 12 to the load 11 so as to operate the load 11. Under the same circumstances, if the first FET 20*a* and the second FET 20*b* are switched OFF, no current flows through the first FET 20*a* and the second FET 20*b*, and the power supply from the DC power supply 12 to the load 11 is stopped. At this point, the load 11 does not operate.

Configuration of Power Feeding Control Device 10

The power feeding control device 10 of Embodiment 4 includes all the components included in the power feeding control device 10 of Embodiment 1 except for the device resistor 24 and the booster circuit 25. The first drive circuit 21*a* and the second drive circuit 21*b* are connected to the positive terminal Tp instead of the output terminal of the booster circuit 25. The first drive circuit 21*a* and the second drive circuit 21*b* are not connected to the connection node between the first FET 20*a* and the second FET 20*b*, and monitors the voltage at the positive terminal Tp, with respect to the diode potential, rather than the intermediate voltages as in Embodiment 3.

When the DC power supply 12 is in normal connection, The first drive circuit 21*a* switches the first FET 20*a* ON by applying the voltage of the DC power supply 12 to the first FET 20*a*. The first drive circuit 21*a* stops applying the voltage of the DC power supply 12 and switches OFF the first FET 20*a* by adjusting the potential of the gate of the first FET 20*a* to the diode potential.

Similarly, when the DC power supply 12 is in normal connection, the second drive circuit 21*b* switches ON the second FET 20*b* by applying the voltage of the DC power supply 12 to the second FET 20*b*. The second drive circuit 21*b* stops applying the voltage of the DC power supply 12 and switches OFF the second FET 20*b* by adjusting the potential of the gate of the second FET 20*b* to the diode potential.

Configurations of First Drive Circuit 21*a* and Second Drive Circuit 21*b*

Figure 9:
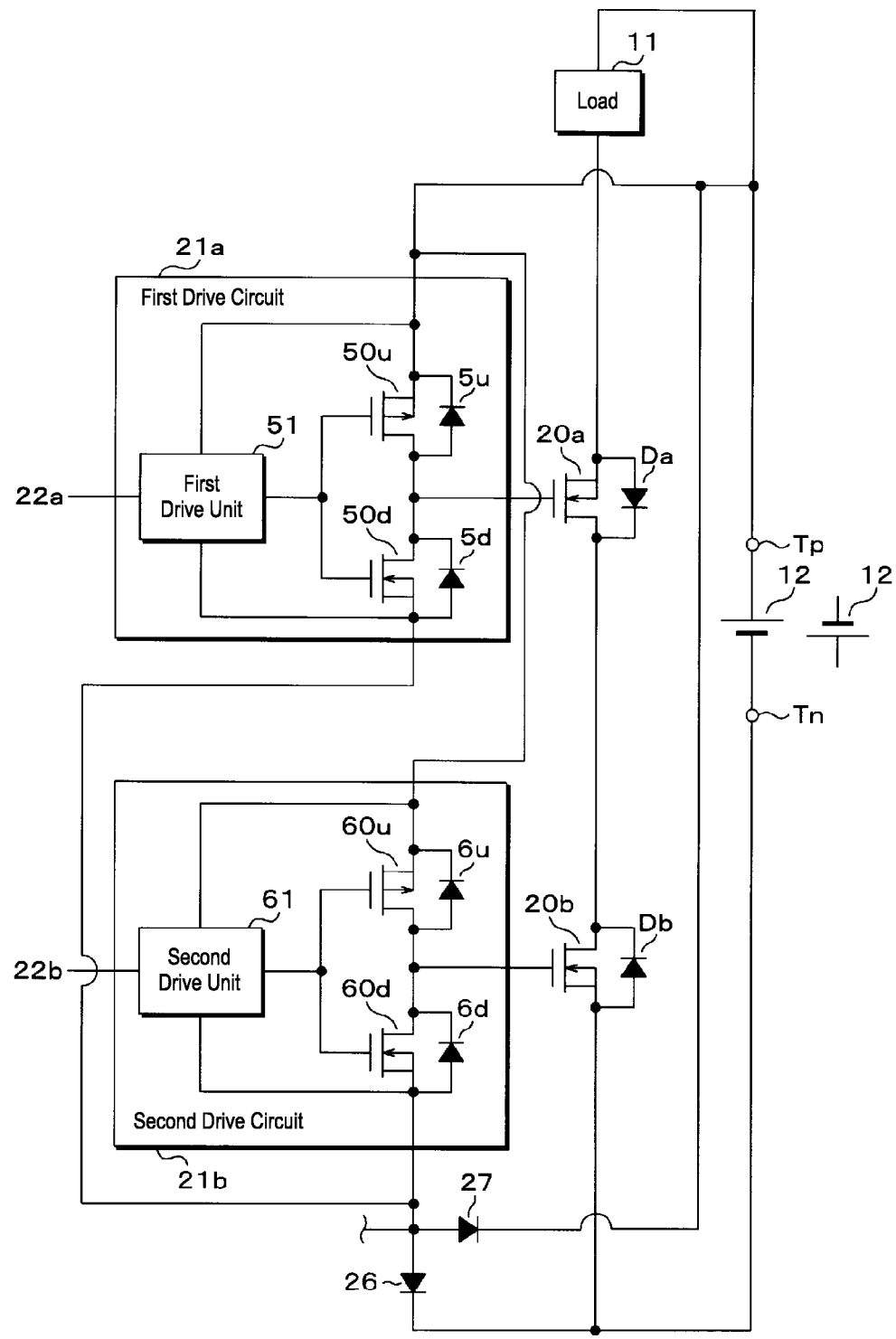
FIG. 9 is a circuit diagram of the first drive circuit and the second drive circuit.

FIG. 9 is a circuit diagram of the first drive circuit 21*a* and the second drive circuit 21*b*. As shown in FIG. 9, the first drive circuit 51 and the second drive unit 61 are each connected to the positive terminal Tp instead of to the connection node between the first FET 20*a* and the second FET 20*b*.

When the DC power supply 12 is in normal connection, the first drive unit 51 of the first drive circuit 21*a* switches ON or OFF each of the upper FET 50*u* and the lower FET 50*d* based on the voltage of the positive terminal Tp, with respect to the diode potential, and the output voltage of the first filter circuit 22*a* as in Embodiment 3. When the upper FET 50*u* and the lower FET 50*d* are ON and OFF, respectively, the voltage of the DC power supply 12 is applied to the gate of the first FET 20*a* to switch ON the first FET 20*a*. When the upper FET 50*u* and the lower FET 50*d* are ON and OFF, respectively, the application of the boosted voltage is stopped and the potential of the gate of the first FET 20*a* is adjusted to the diode potential. As a result, the first FET 20*a* is switched OFF. When the DC power supply 12 is in reverse connection, the first drive unit 51 maintains the upper FET 50*u* and the lower FET 50*d* in the OFF state as in Embodiment 3.

Similarly, when the DC power supply 12 is in normal connection, as in Embodiment 3, the second drive unit 61 of the second drive circuit 21*b* switches ON or OFF the upper FET 60*u* and the lower FET 60*d* based on the voltage of the positive terminal Tp, with respect to the diode potential, and the output voltage of the second filter circuit 22*b*. When the upper FET 60*u* and the lower FET 60*d* are ON and OFF, respectively, the voltage of the DC power supply 12 is applied to the gate of the second FET 20*b* to switch ON the second FET 20*b*. When the upper FET 60*u* and the lower FET 60*d* are ON and OFF, respectively, the application of the boosted voltage is stopped and the potential of the gate of the second FET 20*b* is adjusted to the diode potential. As a result, the second FET 20*b* is switched OFF. When the DC power supply 12 is in reverse connection, the second drive unit 61 maintains the upper FET 60*u* and the lower FET 60*d* in the OFF state as in Embodiment 3.

Effect of First Diode 26

Assume that the DC power supply 12 is in reverse connection with the first diode 26 omitted, that is, with both ends of the first diode 26 shorted in the power feeding control device 10 of Embodiment 4. In this case, as described in the description of Embodiment 1, the voltage of the DC power supply 12 is applied to the gates of the first FET 20*a* and the second FET 20*b*, the value of resistance between the drain and the source is reduced in each of the first FET 20*a* and the second FET 20*b*, and current may flow through the first FET 20*a* and the second FET 20*b*. As a result, the load 11 may operate improperly. However, since the power feeding control device 10 of Embodiment 4 has the first diode 26, when the DC power supply 12 is in reverse connection, the voltage of the DC power supply 12 is not applied to the gates of the first FET 20*a* and the second FET 20*b* via the first drive circuit 21*a* and the second drive circuit 21*b*, respectively.

As described above, when the DC power supply 12 is in reverse connection, the upper FETs 50*u*, 60*u* and the lower FETs 50*d*, 60*d* are switched OFF. The gate of each of the first FET 20*a* and the second FET 20*b* is, for example, connected to the cathode of the first diode 26 through two resistors not shown in the drawings. Therefore, when the voltage of the DC power supply 12 is not applied to the gates of the first FET 20*a* and the second FET 20*b*, the voltage of the gates, with respect to the diode potential, is low in the first FET 20*a* and the second FET 20*b*, and the first FET 20*a* and second FET 20*b* remains OFF.

Effects of Power Feed Control System 10 and Note

The power feeding control device 10 of Embodiment 4 provides the same effects as the power feeding control device 10 of Embodiment 1.

In Embodiment 4, as in Embodiment 2, the switch 70 may be used in place of the second diode 27. In this case, the power feeding control device 10 of Embodiment 4 provides the same effects as the power feeding control device 10 of Embodiment 2.

Embodiment 5

In Embodiment 4, the first FET 20*a* is located upstream of the second FET 20*b* in the current path for current flowing from the positive terminal Tp to the negative terminal Tn. However, where the first FET 20*a* is placed is not limited to the upstream of the second FET 20*b*.

The following describes the specifics of Embodiment 5 that differ from Embodiment 4. It is identical to Embodiment 4 except for the configurations described below. As such, identical reference symbols used in Embodiment 4 are assigned to components identical to those of Embodiment 4, and their description is omitted.

Configuration of Power Feeding Control Device 10

Figure 10:
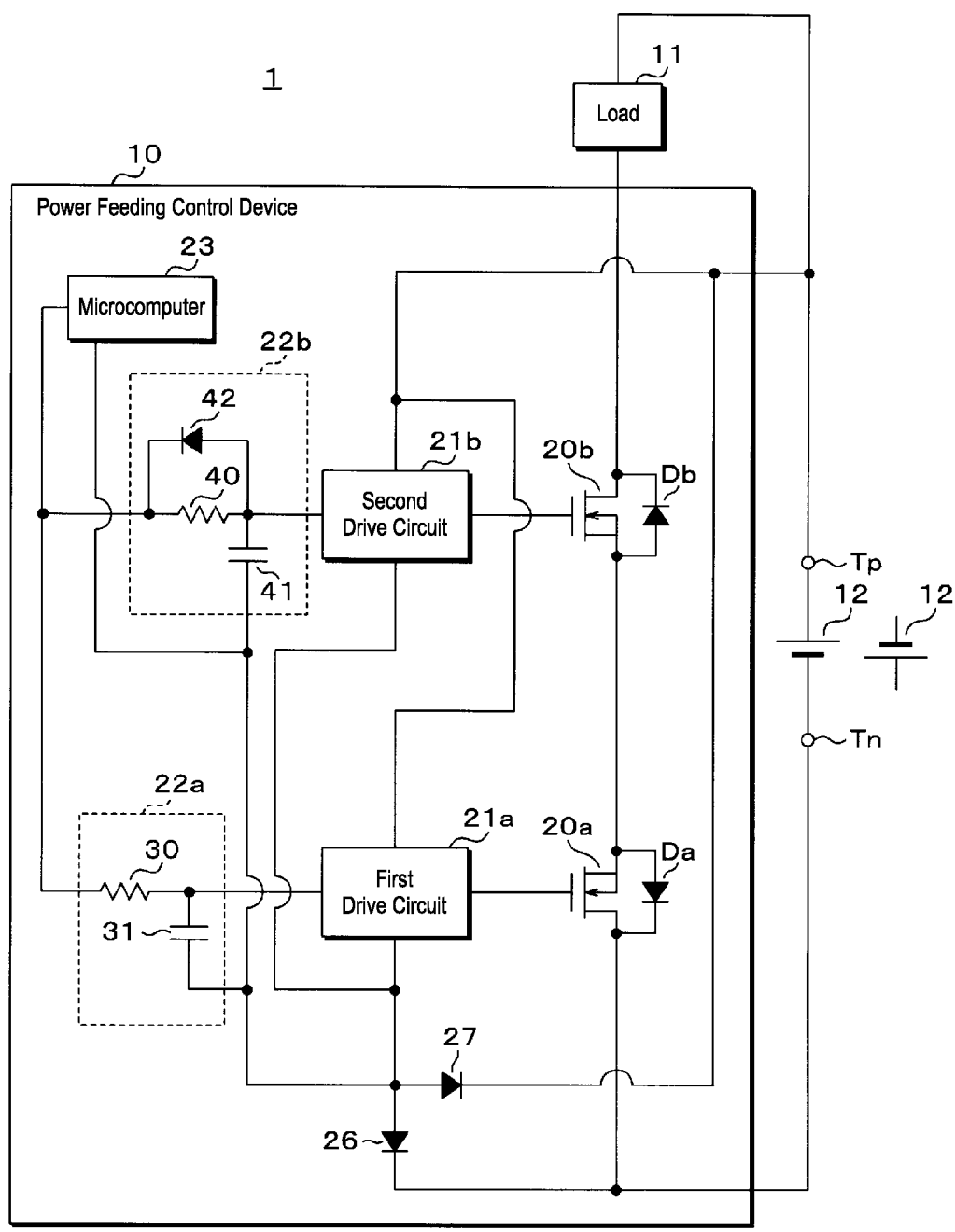
FIG. 10 is a block diagram illustrating the configuration of a main section of a power supply system according to an Embodiment 5.

FIG. 10 is a block diagram illustrating the configuration of a main section of a power supply system 1 of an Embodiment 5. When the power supply system 1 of Embodiment 5 is compared with the power supply system 1 of Embodiment 1, the configuration of the power feed control device 10 is different. When the power feed control device 10 of Embodiment 5 is compared with the power feed control device 10 of Embodiment 4, the first FET 20a and the second FET 20b in the OFF state are disposed in different locations.

The drain and the source of the first FET 20a are connected to the other end of the load 11 and the source of the second FET 20b, respectively. The drain of the second FET 20b is connected to the negative terminal Tn.

Effect of First Diode 26

As in Embodiment 4, the first drive circuit 21a switches ON or OFF the first FET 20a. As in Embodiment 4, the second drive circuit 21b switches ON or OFF the second FET 20b. When the first FET 20a and the second FET 20b are switched ON with the DC power supply 12 in normal connection, current flows from the positive terminal Tp to the load 11, to the second FET 20b, to the first FET 20a, and to the negative terminal Tn in that order. Therefore, the first FET 20a is located downstream of the second FET 20b in the current path for current flowing from the positive terminal Tp to the negative terminal Tn.

Assume that the DC power supply 12 is in reverse connection with the first diode 26 omitted, that is, with both ends of the first diode 26 shorted in the power feeding control device 10 of Embodiment 5. In this case, as described in the description of Embodiment 4, the voltage of the DC power supply 12 is applied to the gates of the first FET 20a and the second FET 20b, the value of resistance between the drain and the source is reduced in each of the first FET 20a and the second FET 20b, and current may flow through the first FET 20a and the second FET 20b. As a result, the load 11 may operate improperly. However, since the power feeding control device 10 of Embodiment 5 has the first diode 26, when the DC power supply 12 is in reverse connection, the voltage of the DC power supply 12 is not applied to the gates of the first FET 20a and the second FET 20b via the first drive circuit 21a and the second drive circuit 21b, respectively.

As in Embodiment 4, when the DC power supply 12 is in reverse connection, the upper FETs 50u, 60u and the lower FETs 50d, 60d are switched OFF. The gate of each of the first FET 20a and the second FET 20b is, for example, connected to the cathode of the first diode 26 through two resistors not shown in the drawings. Therefore, when the voltage of the DC power supply 12 is not applied to the gates of the first FET 20a and the second FET 20b, the voltage of the gates, with respect to the diode potential, is low in the first FET 20a and the second FET 20b, and the first FET 20a and second FET 20b remains OFF.

Effects of Power Feed Control System 10 and Note

The power feeding control device 10 of Embodiment 5 provides the same effects as the power feeding control device 10 of Embodiment 4.

In Embodiment 5, as in Embodiment 2, the switch 70 may be used in place of the second diode 27. In this case, the power feeding control device 10 of Embodiment 5 provides the same effects as the power feeding control device 10 of Embodiment 2.

Variants

In Embodiments 1-5, any circuit will suffice as the first drive circuit 21a as long as it is capable of applying a voltage to the gate of the first FET 20a via the ground terminal when the DC power supply 12 is in reverse connection. Therefore, the configuration of the first drive circuit 21a is not limited to a configuration in which the upper FET 50u and the lower FET 50d are used. Similarly, any circuit will suffice as the second drive circuit 21b as long as it is capable of applying a voltage to the gate of the second FET 20b via the ground terminal when the connection of the DC power supply 12 is in reverse connection. Therefore, the configuration of the second drive circuit 21b is not limited to a configuration in which the upper FET 60u and the lower FET 60d are used.

The disclosed Embodiments 1-5 should be considered to be illustrative in all respects and not restrictive. The scope of the present disclosure is indicated by the claims rather than the above meaning, and all changes that come within of the claims and the meaning and range of equivalency of the claims are intended to be encompassed within the scope of the disclosure.

The invention claimed is:

1. A power feeding control device for controlling power supply to a load from a DC power supply detachably connected between a first terminal and a second terminal, the power feeding control device comprising:
   a first N-channel FET whose drain is located downstream of its source in a current path for current flowing from the first terminal and the second terminal,
   a second N-channel FET whose drain is located upstream of its source in the current path,
   a diode whose cathode is connected to the second terminal, and
   a switching circuit for switching ON or OFF the first FET and the second FET by adjusting a voltage of gates of the first FET and the second FET, with respect to a potential of an anode of the diode,
   wherein a parasitic diode is formed in each of the first FET and the second FET, the parasitic diode's cathode and anode being connected to the drain and the source, respectively;
   a switch connected between the first terminal and the anode of the diode, wherein the switch is OFF when a positive pole and a negative pole of the DC power supply are connected to the first terminal and the second terminal, respectively, and wherein the switch is ON when the negative pole and the positive pole of the DC power supply are connected to the first terminal and the second terminal, respectively.

2. The power feeding control device of claim 1 comprising a second diode whose cathode and anode are connected to the first terminal and the anode of the diode, respectively.

3. The power feeding control device of claim 1, wherein the switch is a semiconductor switch that is ON when a voltage of its control terminal, with respect to the potential of the anode of the diode, is higher than or equal to a predetermined voltage, and
   wherein the control terminal of the switch is connected to the second terminal.

4. The power feeding control device of claim 1, further comprising:
   a booster circuit for boosting a voltage of the first terminal, and
   a resistor connected between the drain and the source of the first FET, wherein, in the current path, the first FET is located upstream of the second FET and the second FET is located upstream of the load, and wherein, when instructed to switch ON the first FET and the second FET, with a voltage at a connection node between the first FET and the second FET higher than or equal to a second predetermined voltage, the switching circuit applies a voltage boosted by the booster circuit to the gates of the first FET and the second FET.

5. The power feeding control device of claim 1, wherein when instructed to switch ON the first FET and the second FET, the switching circuit switches ON the first FET before the second FET.

6. The power feeding control device of claim 1, wherein when instructed to switch OFF the first FET and the second FET, the switching circuit switches OFF the first FET after the second FET.

7. A power feeding control device for controlling power supply to a load from a DC power supply detachably connected between a first terminal and a second terminal, the power feeding control device comprising:
- a first N-channel FET whose drain is located downstream of its source in a current path for current flowing from the first terminal and the second terminal;
- a second N-channel FET whose drain is located upstream of its source in the current path,
- a diode whose cathode is connected to the second terminal;
- a switching circuit for switching ON or OFF the first FET and the second FET by adjusting a voltage of gates of the first FET and the second FET, with respect to a potential of an anode of the diode;
- a parasitic diode is formed in each of the first FET and the second FET, the parasitic diode's cathode and anode being connected to the drain and the source, respectively;
- a booster circuit for boosting a voltage of the first terminal; and
- a resistor connected between the drain and the source of the first FET, wherein, in the current path, the first FET is located upstream of the second FET and the second FET is located upstream of the load, and wherein, when instructed to switch ON the first FET and the second FET, with a voltage at a connection node between the first FET and the second FET higher than or equal to a second predetermined voltage, the switching circuit applies a voltage boosted by the booster circuit to the gates of the first FET and the second FET.

* * * * *